United States Patent [19]

Ishida et al.

[11] Patent Number: 4,719,582
[45] Date of Patent: Jan. 12, 1988

[54] METHOD AND APPARATUS FOR DETERMINING THE CHEMICAL STRUCTURE OF AN UNKNOWN SUBSTANCE

[75] Inventors: Yoshiaki Ishida; Keiji Saito, both of Ube; Tokio Oshima, Tokyo, all of Japan

[73] Assignee: UBE Industries, Ltd., Japan

[21] Appl. No.: 667,628

[22] Filed: Nov. 2, 1984

[30] Foreign Application Priority Data

Nov. 16, 1983 [JP] Japan ................. 58-214153

[51] Int. Cl.⁴ ............................................. G06F 15/42
[52] U.S. Cl. ................................ 364/498; 324/312; 356/303; 364/497
[58] Field of Search ............... 364/496, 497, 498, 499, 364/413; 356/303, 319, 326; 436/43, 173; 324/307, 312

[56] References Cited

U.S. PATENT DOCUMENTS

| | | | |
|---|---|---|---|
| 4,008,388 | 2/1977 | McLafferty et al. | 364/498 |
| 4,267,572 | 5/1981 | Witte | 364/498 |
| 4,365,303 | 12/1982 | Hannah et al. | 364/498 |
| 4,468,742 | 8/1984 | Jenden et al. | 364/497 |

OTHER PUBLICATIONS

Balestra, Bill, and Clignez, "A Computer Controlled ENDOR Spectrometer," J. Phys. E:Sci. Instrum., vol. 12, Sep. 1979.

Primary Examiner—Felix D. Gruber
Assistant Examiner—Edward R. Cosimano
Attorney, Agent, or Firm—Finnegan, Henderson, Farabow, Garrett & Dunner

[57] ABSTRACT

A method and apparatus for determining the chemical structure of an unknown substance wherein spectral data of the unknown substance is detected, a point-assessment is calculated which expresses the degree of possibility of partial structures being contained in the unknown substance based on the spectral data and prememorized chemical shift values corresponding to the partial structures of known substances, it is judged whether the point-assessment is a predetermined threshold value or more and the partial structures with a large possibility of being contained in the unknown substance based on the output of the judgement results are found and displayed. The partial structures thus found are used to determine a molecular structure of the unknown substance.

24 Claims, 7 Drawing Figures

Fig. 5A  $^1CH_3\ ^2CH_2\ ^3CH_2-$ CHEMICAL SHIFT TABLE

Fig. 5B  INPUT SPECTRAL DATA OF UNKNOWN SUBSTANCE

METHOD AND APPARATUS FOR DETERMINING THE CHEMICAL STRUCTURE OF AN UNKNOWN SUBSTANCE

BACKGROUND OF THE INVENTION (1) Field of the Invention

The present invention relates to a method and apparatus for determining the chemical structure of an unknown substance by analysis of the spectral data of the unknown substance obtained from an analysis apparatus, particularly a C-13 nuclear magnetic resonance (below, C-13 NMR) apparatus.

(2) Description of the Prior Art

Up until now, analysis of the structure of an unknown substance has been effected using spectral data by the manual labor and intellectual, mental work of spectroscopists based on their personal experience and spectroscopic theory. This analysis work involves the comparison of the standard spectra of many amount of known substances, judging which features the unknown substance has in common with the spectra of the known substances, and thus deducing the composite elements of the molecular structure, i.e., the partial structures. This takes time and requires considerable experience in data analysis.

Recently, in the field of chemical structural analysis, the same procedures formerly carried out manually by human operators are being performed by computerized data searches, whereby up to tens of thousands of sets of standard spectral data of known substances are compared with the spectral data of the unknown substance so as to determine the chemical structure of the unknown substance.

However, in this conventional method, it is possible to identify an unknown substance as a known substance only when the standard spectral data of the known substance and the spectral data of the unknown substance are a perfect match. Consequently, there is a disadvantage in that no information can be obtained on an unknown substance having a spectrum not included in the standard spectral data. In other words, this conventional method unconditionally considers the position and intensity of the spectral signals in the standard spectral data of the known substances and the spectrum of the unknown substance as specific values and requires complete correspondence of the spectral signals as a condition for identification. Therefore, there is a shortcoming in that a difference in electron density due to a slight difference in molecular structure or a deviation in the numerical value due to an error in measurement makes identification of even a known substance impossible.

Further, up until now, the spectral data of known substances accumulated for C-13 NMR apparatuses covers only approximately 35,000 compounds—even with the most popular collection of standard spectral data compiled by the Satler Co. Almost no data on compounds being daily synthesized for the purpose of development and research of industrial products is contained therein, and for this reason, it is almost impossible, in particular, to determine the chemical structure of byproducts, etc. of synthetic reactions using the conventional method relying on a data search.

SUMMARY OF THE INVENTION

The object of the present invention is, in consideration of the above-mentioned problems in the prior art, to provide a method and apparatus for determining the chemical structure of an unknown substance wherein the partial structures of known substances and the chemical shift values corresponding thereto are stored in advance in a memory apparatus and the chemical shift values and the spectral data of the unknown substance are used to assess, with a membership function, the possibility of the partial structures being contained in the unknown substance and, based on this concept, the partial structures contained in either an unknown substance or known substance can be automatically and quickly deduced and output from the C-13 NMR spectrum, from the results of which output spectroscopists and the like can easily determine the molecular structure.

In accordance with the present invention, there is provided an apparatus for determining the chemical structure of an unknown substance, comprising: a means for detecting spectral data of the unknown substance; a memory means for memorizing at least the chemical shift values corresponding to partial structures of known substances; a means for finding a point-assessment expressing the degree of possibility of partial structures being contained in the unknown substance based on the spectral data of the unknown substance and the data stored in the memory means; comparison means for judging whether the point-assessment is a predetermined threshold value or more; and an output means for displaying the partial structures with a large possibility of being contained in the unknown substance based on the output of the comparison means.

Also, in accordance with the present invention, there is provided a method for determining the chemical structure of an unknown substance comprising detecting spectral data of the unknown substance, finding a point-assessment expressing the degree of possibility of partial structures being contained in the unknown substance based on the spectral data and prememorized chemical shift values corresponding to the partial structures of known substances, judging whether the point-assessment is a predetermined threshold value or more; and finding and displaying the partial structures with a large possibility of being contained in the unknown substance based on the output of the judgement results.

DESCRIPTION OF THE PREFERRED EMBODIMENTS

Below, a detailed description will be made of the method and apparatus of the present invention in reference to the drawings.

Figure 1:
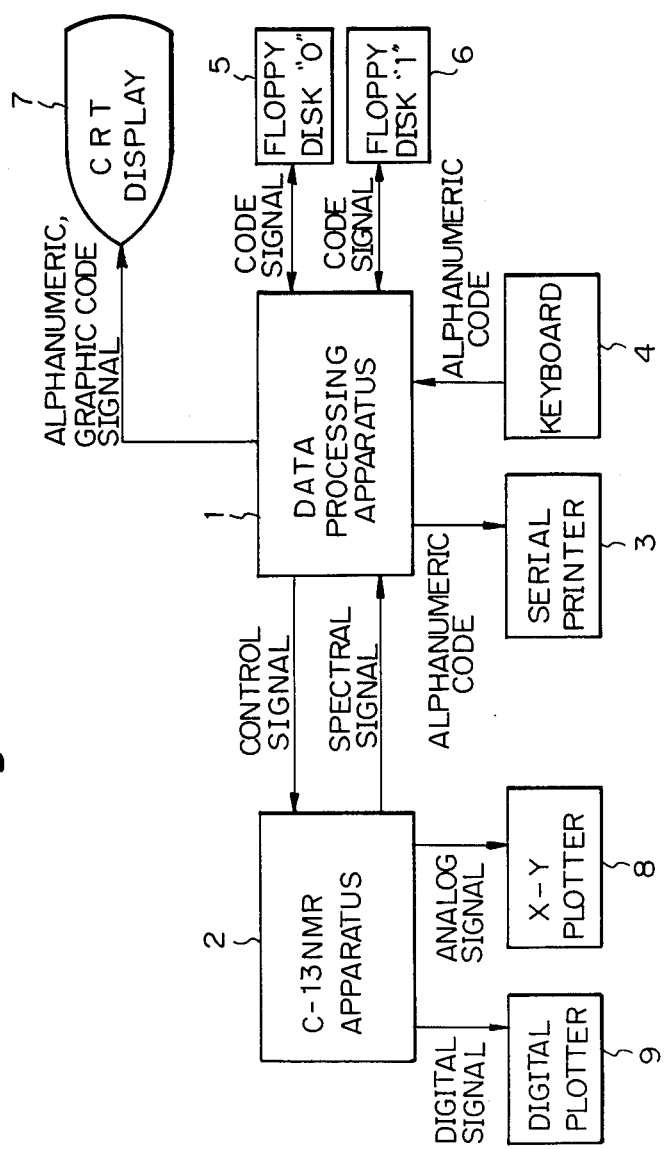
FIG. 1 is a block diagram showing the structure of an apparatus according to an embodiment of the present invention.

FIG. 1 shows the schematic structure of an apparatus for determining the chemical structure of an unknown substance according to the present invention. In the figure, reference numeral 1 represents a data processing apparatus including a central processing unit, an input-/output circuit, and an internal memory unit. The data processing apparatus 1 is connected through the input-/output circuit to a C-13 NMR apparatus 2, serial printer 3, keyboard 4, floppy disks 5 and 6, CRT display 7, etc. The C-13 NMR apparatus 2 generates a spectral signal of the unknown substance in response to a control signal input from the data processing apparatus 1 and inputs the same to the data processing apparatus 1. The C-13 NMR apparatus 2 is connected to an X-Y plotter 8 and digital plotter 9 for the output and display of the spectral data of the unknown substance in an analog and digital mode, respectively. The keyboard 4 connected to the data processing apparatus 1 is used to input various command signals for the data processing apparatus 1 or to perform designation or the like of the processing conditions. The serial printer 3 and CRT display 7 display the partial structures obtained as a result of the analytical processing by the data processing apparatus 1 and other operations. The floppy disks 5 and 6, respectively, for example, store the chemical shift values corresponding to the partial structures of known substances and store the chemical shift values corresponding to aromatic ring carbon atoms.

Figure 2:
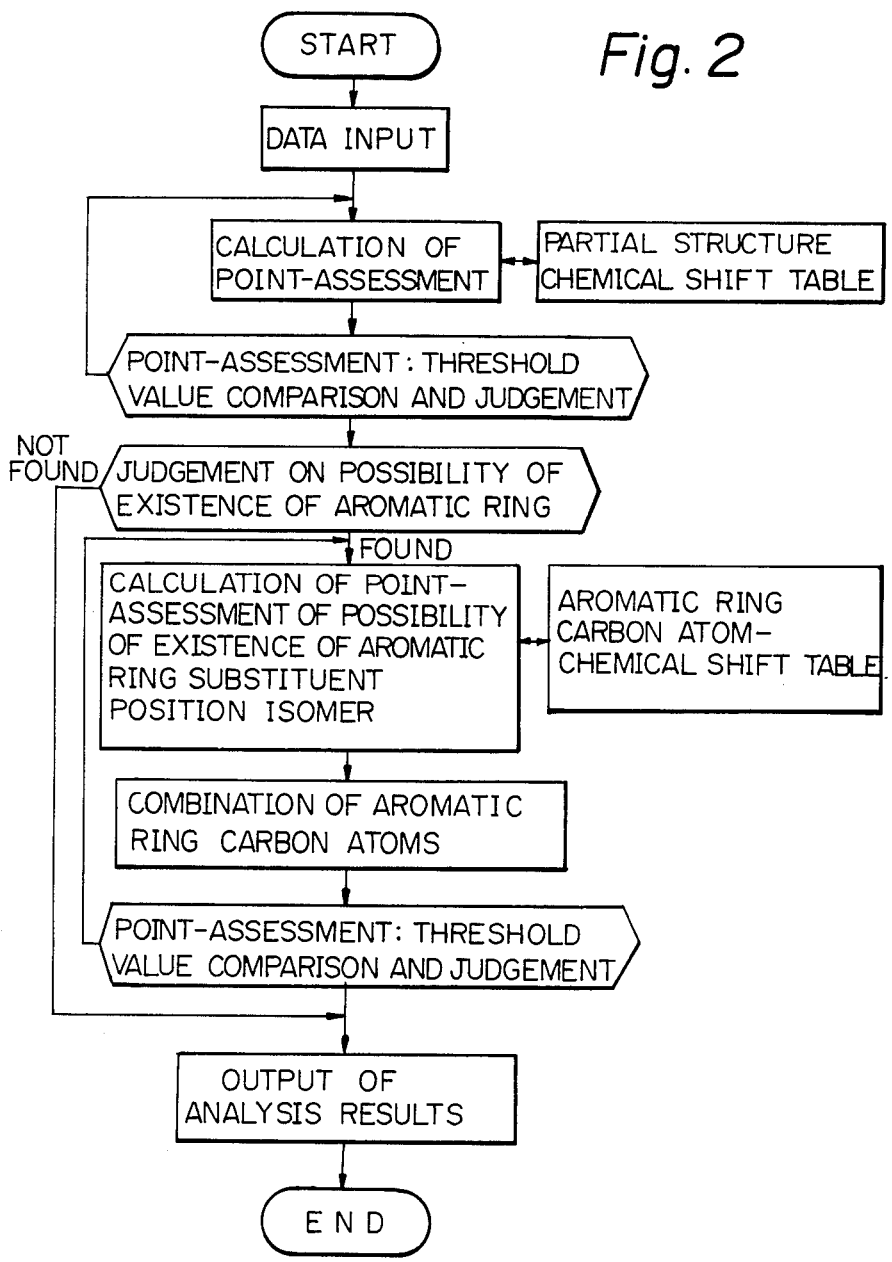
FIG. 2 is a flow chart showing the procedures for processing to determine the chemical structure of an unknown substance in the apparatus of FIG. 1.

Next, an explanation will be given, with reference to FIG. 2, of the procedure for analytical processing of the partial structures of an unknown substance by the apparatus of FIG. 1. First, the spectral data of the unknown substance is input from the C-13 NMR apparatus 2 to the data processing apparatus 1. The C-13 NMR apparatus 2 produces spectral data of the unknown substance by known measurement techniques. Complete decoupling measurement gives data comprising the position (ppm unit) and intensity (relative abundance) of a plurality of signal groups, i.e., spectral signal groups. Off resonance measurement gives the data which is recognized by the operator in the form of numerical data showing the splitting patterns of the signals (singlet, doublet, triplet, quartet, and other multiplet). Table 1 shows an example of the C-13 NMR spectral data in the case of a 2,2,4-trimethylpentane.

TABLE 1

| Signal No. | Position | Intensity | Splitting patterns |
|---|---|---|---|
| 1 | 24.8 | 1.5 | 2 |
| 2 | 25.5 | 5.4 | 4 |
| 3 | 30.1 | 8.9 | 4 |
| 4 | 31.0 | 1.0 | 1 |
| 5 | 53.3 | 2.0 | 3 |

This spectral data is both input to the data processing apparatus 1 and displayed by the X-Y plotter 8 and digital plotter 9.

In the present invention, use is made of spectral data based on complete decoupling measurement. However, the spectral data obtained by off resonance measurement can be added to raise the accuracy of analysis. Further, in addition to the C-13 NMR apparatus 2, a Carbon-Hydrogen-Nitrogen (CHN) elemental analysis apparatus and mass analysis apparatus (MS), etc., can be connected to the data processing apparatus, the data obtained from these apparatuses analyzed, and the determined molecular formulas or atomic composition formulas used to raise the accuracy of the analysis in the same way. Note, the above-mentioned spectral data, etc., can also be input from the keyboard 4 connected to the data processing apparatus 1.

Next, the spectral data input to the data processing apparatus 1 in this way and, for example, the chemical shift table data, etc., stored in the floppy disk 5, are used to calculate a point-assessment showing the degree of possibility of partial structures being contained in the unknown substance.

Here, "chemical shift table" means a numerical table including data such as the position of the spectral signals, etc., corresponding to the partial structures. In this case, a single partial structure includes from 1 to 10 carbon atoms, comprises an atomic group including adjoining hydrogen, oxygen, nitrogen, sulfur, phosphorus, halogen, or other atoms, and has a maximum of five corresponding spectral signals. In other words, a "partial structure" means an atomic group constituting the molecular structure of an organic compound and includes combinations of different types and numbers of atoms and various combinations between atoms by single bonds, double bonds, triple bonds, and other chemical bonding modes. There are countless atom groups, but the present invention processes the structural data on the carbon atom constituents obtained from the C-13 NMR apparatus by considering the partial structures with reference to the carbon atoms and defining the other atoms as those non-carbon atoms which are bonded to the carbon atoms. The partial structure may contain two or more carbon atoms considered equivalent from NMR spectroscopic theory and these often correspond to a single spectral signal, but in principle, the chemical shift table takes the form of a numerical table showing the positions of signals corresponding to the maximum five carbon atoms in the partial structure.

Regarding the above partial structures, statistical arrangement of the positions of spectral signals appearing in the spectral data of known substances shows that the spectral signals corresponding to specific carbon atoms fall within a specific range. The distribution of the same forms a frequency distribution similar to a Gaussian distribution along with the increase in the statistical data. Taking the most often appearing position as the center, a left and right symmetry in the distribution can be found. The reason for the scattering is believed to be the electronic and geometrical nature of the adjoining atoms or atom groups connecting with the free bonding aroms remaining in the partial structures, and also other additional chemical and physical factors. Therefore, to determine the partial structures contained in an unknown substance, it is not possible to exactly specify the position of a corresponding spectral signal. Consequently, in the present invention, the central position and standard deviation obtained as a result of the statistical processing are used to express a range of appearance of a spectral signal. On the other hand, the further the five carbon atoms in the partial structure become from the position of the above-mentioned free bonding arms, the narrower becomes the range of appearance of the corresponding spectral signal. The range of the carbon atom belonging to the end position in the partial structure is the narrowest and contributes the most to determination of the partial structure. Therefore, the five carbon atoms differ in importance in determining the partial structure and, thus, a relative weight is added to the respective signals and included in the chemical shift table. Further, the splitting pattern obtained from off resonance measurement is included in the chemical shift table, since it corresponds to the number of hydrogen atoms directly connected to the carbon atoms based on spectroscopic theory. Table 2 shows an example of the chemical shift table in the case of a partial structure expressing the n-propyl group.

TABLE 2

| $CH_3CH_2CH_2-$ Signal No. | Atomic composition | | $C_3H_7$ | |
|---|---|---|---|---|
| | Central position | Standard deviation | Weight | Splitting patterns |
| 1 | 14 | 5 | 4 | 4 |
| 2 | 22 | 8 | 4 | 3 |
| 3 | 38 | 10 | 2 | 3 |

Figure 3:
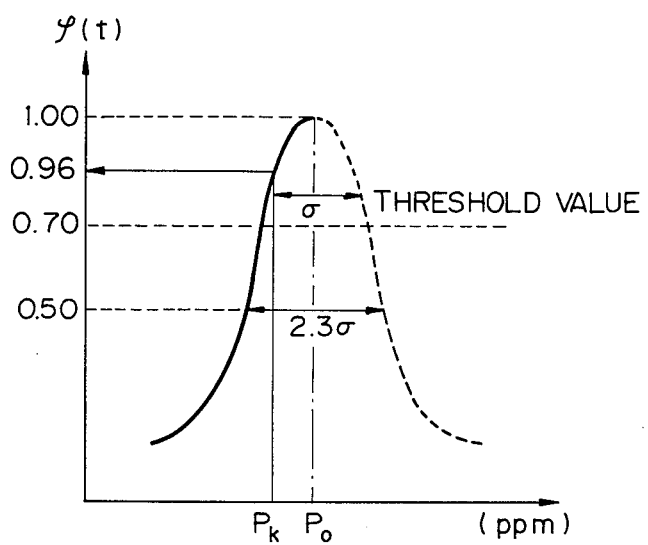
FIG. 3 is a graph explaining the method of calculation of the membership function.

Next, an explanation will be given of the method of calculation of the above-mentioned point-assessment. The present invention enables determination of a similar partial structure even when the spectral signal of the unknown substance deviates from the position of the standard spectral signals accommodated in the chemical shift table by use of a membership function of the Fuzzy System Theory. The frequency of occurrence of deviation of a spectral signal actually measured for an unknown substance has been found, by statistical processing of the spectra of a plurality of known substances, to be Gaussian in distribution. Consequently, the Gaussian function is taken as the membership function. Such a membership function, as shown in FIG. 3, is 1.00 when the position of a specific spectral signal of the spectral data of an unknown substance completely matches the central position of the spectral signals accommodated in the chemical shift table and changes down to 0.00 when not matching, assuming that the degree of deviation follows a Gaussian distribution along with the distance from the central position. The closer the function to 1.00, the greater the similarity between the specific spectral signal of the spectral data of the unknown substance and the spectral signal belonging to a corresponding partial structure. The membership function $\phi(t)_i$ is defined as follows:

$$t_i = \frac{|P_0 - P_k|}{\sigma} \quad (1)$$

$$\phi(t)_i = \exp(-\tfrac{1}{2}t_i^2) \quad (2)$$

In the above formula, $P_0$ is the central position, i.e., the central frequency; $P_k$ is the position of the specific spectral signal of the unknown substance, i.e., frequency; and $\sigma$ is the standard deviation.

Figure 4:
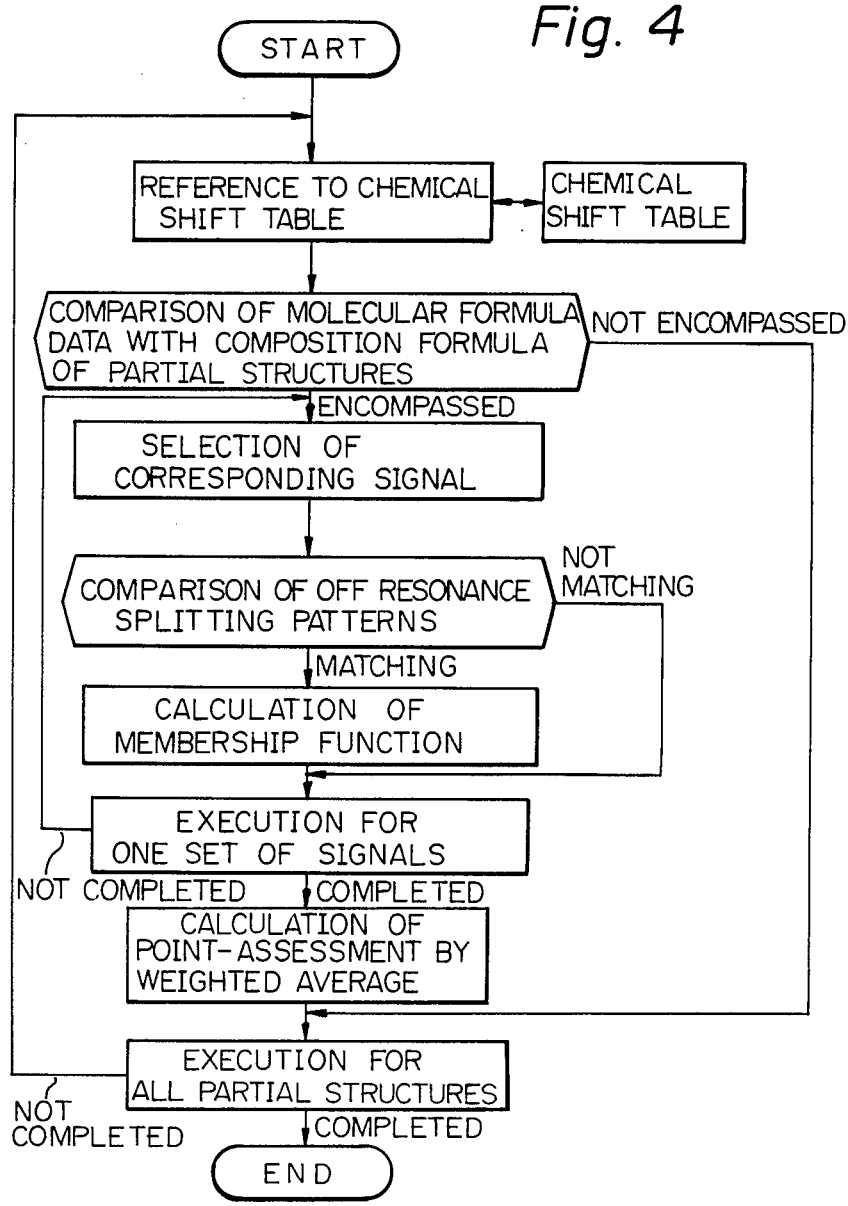
FIG. 4 is a flowchart showing the details of the processing for calculating the point-assessment in FIG. 2.

Next, detailed explanation will be given of the processing for calculation of the point-assessment with reference to FIG. 4. First, one set of data corresponding to one partial structure is read from the chemical shift table accommodated in the memory apparatus.

Next, if a molecular formula or atomic composition formula is input, judgement is made of whether it encompasses the atomic composition given in the chemical shift table for said partial structure. When not encompassing it, the partial structure is clearly not included in the unknown substance due to the type and number of the atoms of the unknown substance. Therefore, calculation processing of the point-assessment stated below is not performed, and processing of a next partial structure is proceeded to. If the input molecular formula data, etc. encompasses the atomic composition given in the chemical shift table for the partial structure, the spectral signal of the unknown substance positioned closest to the central position shown in the data read out from the chemical shift table is selected from the input data.

At this time, if the off resonance measurement data is input, judgement is made of whether the number of splitting patterns of the input spectral signal matches the number of splitting patterns given in the chemical shift table. When matching, calculation of the above-mentioned membership function is performed for the spectral signal. If the number of splitting patterns does not match, calculation of the membership function is not performed. In this way, calculation of the membership function is performed or not performed for each spectral signal of the set read out from the chemical shift table.

Next, the weight contained in the data read out from the chemical shift table is used to find the weighted average of the maximum five spectral signals using the following formula (3) and the point-assessment of the possibility of the partial structure being contained in the unknown substance calculated.

$$\phi_T = \frac{\sum\limits_i W_i \cdot \phi(t)_i}{\sum\limits_i W_i} \quad (3)$$

The above processing is successively executed on all partial structures contained in the chemical shift table, whereby the calculation processing of the point-assessment is completed.

Figure 5:
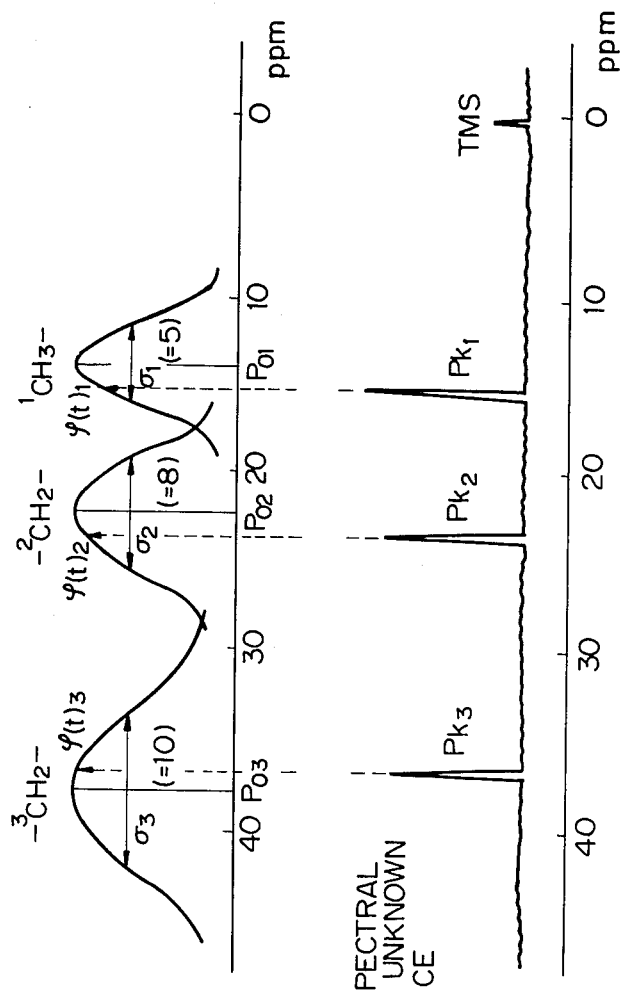
FIGS. 5A and 5B are graphs explaining in detail the method for calculating the point-assessment.

Referring to FIG. 5, a concrete explanation will be made of the method of calculation of the point-assessment for an example of an n-propyl group. FIG. 5(a) shows generally by a graph the data of the chemical shift table of the n-propyl group shown in the above-mentioned Table 2. As clear from Table 2, the n-propyl group has three spectral signals 1, 2, and 3, the central positions $P_{01}$, $P_{02}$, and $P_{03}$ of the spectral signals of which are 14 ppm, 22 ppm, and 38 ppm, respectively. The standard deviations $\sigma_1$, $\sigma_2$, and $\sigma_3$ are 4, 8, and 10 ppm respectively. Incidentally, the spectral signals 1, 2, and 3 correspond to the atom groups $^1CH_3-$, $-^2CH_2-$, and $-^3CH_2-$, respectively.

As against the data of the chemical shift table, suppose spectral data including three spectral signals having central positions of $P_{k1}$, $P_{k2}$, and $P_{k3}$, and shown in FIG. 5(b), is input. Using the above-mentioned formula (1), the value of $t_i$ ($i=1, 2,$ and 3) corresponding to the spectral signals is sought, giving:

$$t_1 = \frac{|P_{01} - P_{k1}|}{\sigma_1}$$

$$t_2 = \frac{|P_{02} - P_{k2}|}{\sigma_2}$$

$$t_3 = \frac{|P_{03} - P_{k3}|}{\sigma_3}$$

The values of $t_1$, $t_2$, and $t_3$ given here are replaced in the above-mentioned formula (2) to find the membership functions $\phi(t)_1$, $\phi(t)_2$, and $\phi(t)_3$. Then, the above-mentioned formula (3) is used to calculate the point-assessment $\phi_T$. In this case, $\phi_T$ becomes $$\phi_T = \frac{W_1\phi(t)_1 + W_2\phi(t)_2 + W_3\phi(t)_3}{W_1 + W_2 + W_3} \qquad 5$$

Here, $W_1$, $W_2$, and $W_3$ are values showing the weight of spectral signals 1, 2, and 3 shown in the above-mentioned chemical shift table of Table 2.

Judgement is made of whether the point-assessment found in this way is a predetermined threshold value or more, for example, 0.70 or more. Since the possibility that a partial structure having a point-assessment of the predetermined threshold value or more being included in the unknown substance is great, it is displayed through the serial printer 3 and the CRT display 7, etc., in the apparatus of FIG. 1. The above processing is repeatedly performed for each set for all the sets of data included in the chemical shift table. The display of the partial structures judged to have a greater possibility of inclusion in the unknown substance by the above processing obviously may be also performed after the completion of all the processing.

The display of the analysis results includes, for example, all the input data of the unknown substance, chemical formulas of the partial structures expressed using code symbols of the partial structures or alpha-numerics, the positions of the spectral signals utilized for the calculation of the membership function, the point-assessments, etc. The display of the position of the spectral signals, the point-assessments, etc., may be omitted from the output, if not necessary.

The above procedure enables the determination of which partial structures are contained in an unknown substance. The present invention, however, offers another type of processing in which a procedure similar to the above is used to further judge the possibility of the unknown substance being an aromatic ring substituent or another substituent, thereby further clarifying the chemical structure of the unknown substance. For example, when the unknown substance includes a substituted aromatic ring, referring again to the flowchart of FIG. 2, after first completing the above-mentioned processing using the chemical shift table corresponding to the partial structures, judgement is made on the possibility of the unknown substance having a benzene ring or other aromatic ring. If there is a possibility that an aromatic ring exists in the unknown substance, the chemical shift table of aromatic ring carbon atoms is used to calculate the point-assessment showing the possibility of the isomeric structure of the substituted position of the unknown substance using the same membership function as described above.

In this case, the chemical shift table of the aromatic ring carbon atoms stores the positions, etc., of spectral signals corresponding to a plurality of aromatic ring partial structures of known substances. In general, a single aromatic ring partial structure is a partial structure having only one carbon atom in the ring in which a specific substituent is introduced and a single spectral signal corresponding thereto. The carbon atom of the root of the substituent is hereinbelow called the "significant ring carbon atom." The aromatic ring partial structure is defined by the atom directly substituted on the significant ring carbon atom, the atoms of the substituents at the ortho positions adjoining the significant ring carbon atom, and the atom of the substituent of the para position opposing its across the ring. This is a definition unique to this invention. For example, in the case of benzene ring, the partial structure is defined as follows;

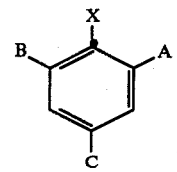

In the above, X is the atom of the specific substituent group, • is the significant ring carbon atom, A and B are the atoms of the substituent groups of the ortho positions, and C is the atom of the substituent group of the para position.

Aromatic compounds consist of a chemically stable ring portion, wherein carbon, oxygen, nitrogen, sulfur, and other atoms form a ring structure, and a substituent group portion comprising atom groups similar to the above-mentioned partial structures. In the case of a benzenoid compound, the ring portion comprises six carbon atoms, and has bondable positions at six locations. In the substituent itself, numerous combinations of modes of bonding with atoms are possible. Consequently, there are innumerable structures of aromatic ring portions in existence.

A statistical compilation of spectral signals appearing in the spectral data of various known substances shows the spectral signals of the abovementioned significant ring carbon atom of an aromatic ring partial structure exhibits a Gaussian distribution over a specific range. The reason for this scattering is though to be the effects exerted electronically and geometrically on the significant ring carbon atom by the atoms or atomic groups bonded further ahead of the atoms at the ortho position, para position, and the directly bonded atoms. Consequently, to determine the aromatic ring partial structure contained in an unknown substance, since the corresponding spectral signal position cannot be specified, the present invention provides a numerical table using the two ends of the range of shift obtained as a result of statistical processing (highest position and lowest portion). Table 3 shows an example of a chemical shift table of an aromatic ring carbon atom in the case of substitution of methyl groups at the 1, 2, 4, and 6 positions of the benzene ring, i.e., having the following structure (atomic composition: $C_{10}H_{12}$):

TABLE 3

| Atomic composition | $C_{10}H_{12}$ |
|---|---|
| Highest position | Lowest position (ppm) |
| 131.5 | 134.5 |

Using the above chemical shift table of the aromatic ring carbon atom, the point-assessment showing the possibility that the unknown substance is an aromatic ring substituent position isomer is calculated. Point-assessments are calculated for all aromatic ring partial structures. All the aromatic ring partial structures where the point-assessment reaches a predetermined threshold or more, for example, 0.30 or more, are taken out. The combination of these aromatic ring partial structures enables a single aromatic ring structure to be found. Point-assessments for the set of aromatic ring partial structures so combined are then calculated. When the point-assessments reach a predetermined threshold or more, e.g., 0.70 or more, the unknown substance is judged to contain the set of the aromatic ring partial structures combined as mentioned above and those aromatic ring partial structures are displayed.

Figure 6:
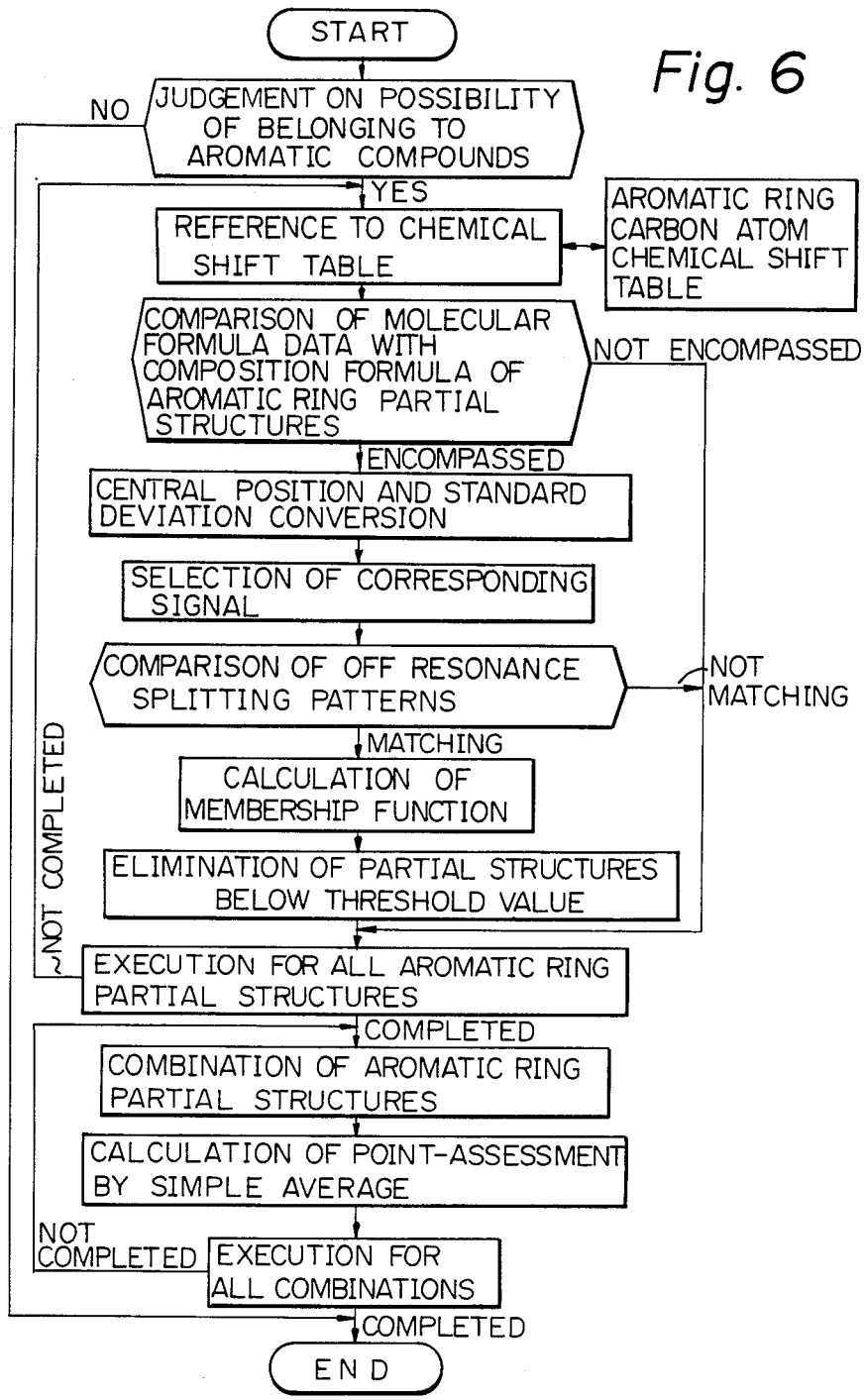
FIG. 6 is a flowchart showing details of the processing for calculating the point-assessment showing the possibility of an aromatic ring substituent position isomer in FIG. 2.

The above processing will be explained in detail with reference to FIG. 6. First, judgement is made on the possibility of the unknown substance being a substituent of an aromatic compound using the input data of the C-13 NMR spectra. When there is a possibility that the unknown substance is a substituent of an aromatic compound, one set of data is taken out from the chemical shift table of the aromatic ring carbon atoms. If a molecular formula or atomic composition formula is input, the data of the molecular formula, etc., is compared with the composition formula of the aromatic ring partial structure and it is judged whether the said aromatic ring partial structure encompasses the atomic composition given in the chemical shift table. If not encompassing it, processing for a next aromatic ring partial structure is proceeded to. If encompassing it, substitution processing is carried out assuming the center point between the frequency of the highest position included in the data taken out from the chemical shift table and the frequency of the lowest position to be the central frequency i.e., the central position, for convenience's sake and the distance between the highest position and the lowest position to be a standard deviation. The spectral data of the unknown substance corresponding to the position closest to the substituted central position is selected from the input data.

On the other hand, if off resonance measurement data is input, judgement is made of whether the number of splitting patterns of the spectral signal matches the number of splitting patterns showning by the code symbol of an aromatic ring partial structure given in the chemical shift table. When not matching, processing of a next aromatic ring partial structure is proceeded to. Using the characteristic that the number of splitting patterns of the spectral signal is 2 when the atom bonded to the significant ring carbon atom is hydrogen and is 1 when another atom, and using the code symbol showing the aromatic ring partial structure given in the chemical shift table of the aromatic ring carbon atom, the numbers of splitting patterns are compared. When the numbers of splitting patterns match, the above-mentioned formulas (1) and (2) are used to calculate the membership function. When the membership function value is less than the threshold value, e.g., 0.30, set for convenience sake, the aromatic ring partial structure is eliminated as not being included in the structure of the unknown substance.

The above-mentioned processing is executed for all aromatic ring partial structures contained in the chemical shift table of the aromatic ring carbon atom.

The aromatic ring partial structures of the threshold value or more, set for convenience, are thus found; the combinations forming mutually adjoining ring structures are found from these aromatic ring partial structures; a simple average using 1 as the weight of spectral signals is calculated using formula (3); and the point-assessment of the possibility of inclusion in the unknown substance as a ring structure as a whole is calculated. In other words, the aromatic ring partial structure corresponds to a spectral signal corresponding to only one significant ring carbon atom, but defines the ortho position, para position, and atoms of the directly bonded substituent groups as subsidiary information for expressing the partial structure. Therefore, for example, in the case of a benzene ring, when six aromatic ring partial structures are considered, there exists a combination which satisfies the information relating to the substituent groups and which can explain the positional relationship in the ring of all the six carbon atoms and the positional relationship of the substituent groups.

For example, the set of the aromatic ring partial structures in the case of 2,4 dimethylphenol is as follows.

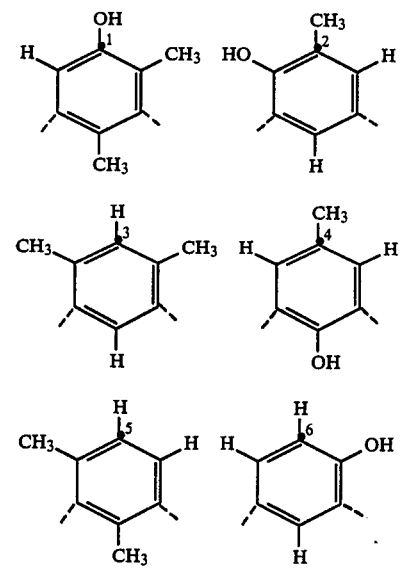

The combination of these aromatic ring partial structures enables the following ring structure to be found

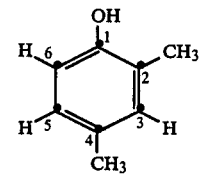

After detection of the combination of the aromatic ring partial structures as described above, point-assessments are calculated by the simple average, as explained before. When the point-assessments are calculated for all the combinations, judgement is made as to whether said point-assessments reach a predetermined threshold value or more, for example, 0.70 or more, and judgement is made on the existence of a possibility of the ring structures being included in the unknown substance. As a result, the ring structure with the largest possibility of inclusion in the chemical structure of the unknown substance is displayed on the output apparatus in the same way as described above.

EXAMPLES (1) Example of analysis of chalcone

Assuming chalcone in the unknown substance, the input data is as follows:

Molecular formula: $C_{15}H_{12}$

| Signal No. position (ppm) | Chemical shift | Intensity | No. of splitting patterns |
|---|---|---|---|
| 1 | 122.0 | 2.0 | 2 |
| 2 | 128.4 | 9.3 | 2 |
| 3 | 128.8 | 4.8 | 2 |
| 4 | 130.3 | 2.1 | 2 |
| 5 | 132.5 | 2.2 | 2 |
| 6 | 134.8 | 1.4 | 1 |
| 7 | 138.2 | 1.0 | 1 |
| 8 | 144.4 | 1.8 | 2 |
| 9 | 189.9 | 1.1 | 1 |

As the output results of this data, the following five partial structures are output as partial structures with a large possibility of inclusion in the structure of the substance. Two of these are the benzene ring structure assembled by the aromatic ring partial structures.

 1.

 2.

 3.

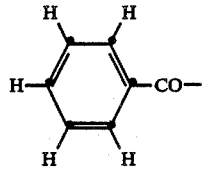 4.

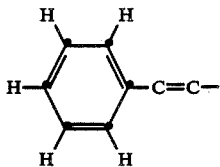 5.

$C_6H_5$ expresses the monosubstituent benzene, CH=CH or C=C the double bonded portion, and CO the carbonyl group (>C=O). The above five partial structures include mutually compatible contents. Based on these results, it is easy to determine the structural formula of chalcone:

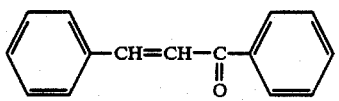

(2) Example of m-Bromotoluene
Assuming m-bromotoluene

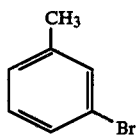

is the unknown substance, the input data is as follows:

Molecular formula: $C_7H_7Br$

| Signal No. position (ppm) | Chemical shift | Intensity | No. of splitting patterns |
|---|---|---|---|
| 1 | 21.0 | 3.9 | 4 |
| 2 | 122.3 | 5.0 | 1 |
| 3 | 127.6 | 8.8 | 2 |
| 4 | 128.5 | 8.2 | 2 |
| 5 | 129.6 | 7.8 | 2 |
| 6 | 132.0 | 7.7 | 2 |
| 7 | 139.9 | 3.0 | 1 |

Two partial structures are output, one of which corresponds to the correct structural formula assembled by the aromatic ring partial structure.

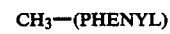 1.

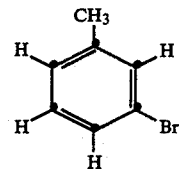 2.

(3) Example of Bis-(4-dimethylamine)thiobenzophenone
Assuming Bis-(4-dimethylamine)thiobenzophenone

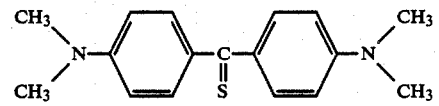

is the unknown substance, the input data is as follows:

Molecular formula: $C_{17}H_{20}N_2S$

| Signal No. position (ppm) | Chemical shift | Intensity | No. of splitting patterns |
|---|---|---|---|
| 1 | 40.0 | 7.5 | 4 |
| 2 | 110.0 | 10.0 | 2 |
| 3 | 132.7 | 8.5 | 2 |
| 4 | 136.3 | 1.7 | 1 |
| 5 | 152.9 | 1.4 | 1 |
| 6 | 228.7 | 0.4 | 1 |

The following three partial structures are output, of which numbers 1 and 3 are correct. The number 2 isothiocyanate group is not correct and the position of the spectral signal only coincidentally matches. A wrongly output partial structural resembling the correct partial structure is sometimes called "noise."

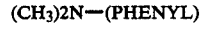 1.

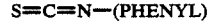 2.

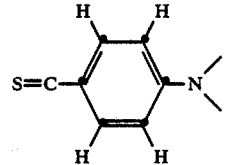 3.

As explained in the above text and examples, the present invention makes it possible, in the process of operations for determining the chemical structure of an unknown substance, to determine in a short time the partial structures contained in the unknown substance based on the spectral data of the unknown substance, thereby making it possible for a spectroscopist or general chemist to easily and quickly determine the chemical structure. Further, the present invention does not require advanced skill and experience in spectroscopic techniques and eliminates the errors arising from the preconceptions and omissions to which human thought processes are so susceptible, thereby enabling the accurate determination of chemical structures.

What is claimed is:

1. An apparatus for determining the chemical structure of an unknown substance, comprising: a means for detecting spectral data of the unknown substance; a memory means for memorizing at least the chemical shift values corresponding to partial structures of known substances; a means for finding a point-assessment expressing the degree of possibility of partial structures being contained in the unknown substance based on the spectral data of the unknown substance and the data stored in said memory means; comparison means for judging whether said point-assessment is a predetermined threshold value or more; and an output means for displaying the partial structures with a large possibility of being contained in the unknown substance based on the output of said comparison means.

2. An apparatus according to claim 1, wherein said partial structures include carbon atoms and non-carbon atoms bonded to said carbon atoms.

3. An apparatus according to claim 1, wherein said means for detecting spectral data of an unknown substance is a C-13 NMR apparatus.

4. An apparatus according to claim 1, wherein said point-assessment is obtained by sequentially deriving data for each partial structure, by calculating membership function $\phi(t)_i$ for every spectral data of each partial structure emcompassed in the unknown substance according to the following formulas:

$$t_i = \frac{|P_0 - P_k|}{\sigma}$$

$$\phi(t)_i = \exp(-\tfrac{1}{2}t_i^2)$$

wherein $P_0$ is the central freuency, $P_k$ is the frequency of each spectral data, and $\sigma$ is the standard deviation, and by calculating the weighted average $\phi_T$ of the membership functions of said spectral data of said partial structure according to the following formula:

$$\phi_T = \frac{W_1\phi(t)_1 + W_2\phi(t)_2 + \ldots}{W_1 + W_2 + \ldots}$$

wherein $W_1, W_2, \ldots$ are weights of said spectral data, said weighted average $\phi_T$ being used as said point-assessment.

5. An apparatus according to claim 4, wherein said membership function is calculated only for every input spectral data whose number of splitting patterns coincides with the number of splitting patterns of the spectral data of the partial structure.

6. An apparatus according to claim 1, wherein said memory means stores a chemical shift table including at least the central position and the standard deviation of each spectral signal for every partial structure.

7. An apparatus according to claim 6, wherein said chemical shift table further includes weight data for every spectral signal.

8. An apparatus according to claim 6, wherein said chemical shift table further includes splitting pattern data for every spectral signal.

9. An apparatus according to claim 1, wherein said memory means stores the chemical shift values corresponding to a plurality of aromatic ring partial structures of known substances.

10. An apparatus according to claim 9, wherein said chemical shift values include data of highest and lowest positions of the shift range of the spectral signal of every partial structure.

11. An apparatus according to claim 9, wherein said point-assessment is obtained by sequentially deriving data for each aromatic ring partial structure, by calculating membership function $\phi(t)_i$ for every spectral data of each aromatic ring partial structure emcompassed in the unknown substance according to the following formulas:

$$t_i = \frac{|P_0 - P_k|}{\sigma}$$

$$\phi(t)_i = \exp(-\tfrac{1}{2}t_i^2)$$

wherein $P_0$ is the central frequency, $P_k$ is the frequency of each spectral data, and $\sigma$ is the standard deviation, by combining aromatic ring partial structures each having membership function equal to or larger than a predetermined threshold value so as to form a ring structure, and by calculating the weighted average $\phi_T$ of the membership functions of said spectral data of said partial structures according to the following formula:

$$\phi_T = \frac{W_1\phi(t)_1 + W_2\phi(t)_2 + \ldots}{W_1 + W_2 + \ldots}$$

wherein $W_1, W_2, \ldots$ are weights of said spectral data, said weighted average $\phi_T$ being used as said point-assessment.

12. An apparatus according to claim 11, wherein said membership function is calculated only for every input spectral data whose number of splitting patterns coincides with the number of splitting patterns of the spectral data of the aromatic ring partial structure.

13. A method for determining the chemical structure if an unknown substance comprising detecting spectral data of the unknown substance, finding a point-assessment expressing the degree of possibility of partial structure being contained in the unknown substance based on said spectral data and prememorized chemical shift values corresponding to the partial structures of known substances, judging whether said point-assessment is a predetermined threshold value or more, thereby producing judgement results, and finding and displaying the partial structures with a large possibility of being contained in the unknown substance based on the output of said judgement results.

14. A method according to claim 13, wherein said partial structures include carbon atoms and non-carbon atoms bonded to said carbon atoms.

15. A method according to claim 13, wherein said spectral data of an unknown substance is detected by a C-13 NMR apparatus.

16. A method according to claim 13, wherein said point-assessment is obtained by sequentially deriving data for each partial structure, by calculating membership function $\phi(t)_i$ for every spectral data of each partial structure emcompassed in the unknown substance according to the following formulas:

$$t_i = \frac{|P_0 - P_k|}{\sigma}$$

$$\phi(t)_i = \exp(-\tfrac{1}{2} t_i^2)$$

wherein $P_0$ is the central frequency, $P_k$ is the frequency of each spectral data, and $\sigma$ is the standard deviation, and by calculating the weighted average $\phi_T$ of the membership functions of said spectral data of said partial structure according to the following formula:

$$\phi_T = \frac{W_1 \phi(t)_1 + W_2 \phi(t)_2 + \cdots}{W_1 + W_2 + \cdots}$$

wherein $W_1, W_2, \ldots$ are weights of said spectral data, said weighted average $\phi_T$ being used as said point-assessment.

17. A method according to claim 16, wherein said membership function is calculated only for every input spectral data whose number of splitting patterns coincides with the number of splitting patterns of the spectral data of the partial structure.

18. A method according to claim 13, wherein said prememorized chemical shift values include at least the central position and the standard deviation of each spectral signal for every partial structure.

19. A method according to claim 18, wherein said prememorized chemical shift values further include weight data for every spectral signal.

20. A method according to claim 18, wherein said prememorized chemical shift values further include splitting pattern data for every spectral signal.

21. A method according to claim 13, wherein said prememorized chemical shift values include those corresponding to a plurality iof aromatic ring partial structures of known substances.

22. A method according to claim 21, wherein said prememorized chemical shift values include data of highest and lowest positions of the shift range of the spectral signal of every partial structure.

23. A method according to claim 21, wherein said point-assessment is obtained by sequentially deriving data for each aromatic ring partial structure, by calculating membership function $\phi(t)_i$ for every spectral data of each aromatic ring partial structure emcompassed in the unknown substance according to the following formulas:

$$t_i = \frac{|P_0 - P_k|}{\sigma}$$

$$\phi(t)_i = \exp(-\tfrac{1}{2} t_i^2)$$

wherein $P_0$ is the central frequency, $P_k$ is the frequency of each spectral data, and $\sigma$ is the standard deviation, by combining aromatic ring partial structures each having membership function equal to or larger than a predetermined threshold value so as to form a ring structure, and by calculating the weighted average $\phi_T$ of the membership functions of said spectral data of said partial structures according to the following formula:

$$\phi_T = \frac{W_1 \phi(t)_1 + W_2 \phi(t)_2 + \cdots}{W_1 + W_2 + \cdots}$$

wherein $W_1, W_2, \ldots$ are weights of said spectral data, said weighted average $\phi_T$ being used as said point-assessment.

24. A method according to claim 23, wherein said membership function is calculated only for every input spectral data whose number of splitting patterns coincides with the number of splitting patterns of the spectral data of the aromatic ring partial structure.

* * * * *